US006198352B1

(12) United States Patent
Tanji

(10) Patent No.: US 6,198,352 B1
(45) Date of Patent: Mar. 6, 2001

(54) RADIO FREQUENCY LOW NOISE AMPLIFIER FABRICATED IN COMPLEMENTARY METAL OXIDE SEMICONDUCTOR TECHNOLOGY

(75) Inventor: Todd M. Tanji, Egan, MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/197,117

(22) Filed: Nov. 20, 1998

Related U.S. Application Data

(60) Provisional application No. 60/066,222, filed on Nov. 20, 1997.

(51) Int. Cl.[7] ................. H03F 3/04; H03F 3/14
(52) U.S. Cl. ............................. 330/302; 330/307
(58) Field of Search ..................... 330/277, 302, 330/307

(56) References Cited

U.S. PATENT DOCUMENTS

| 4,658,220 | * | 4/1987 | Heston et al. | 330/277 |
| 4,853,649 | * | 8/1989 | Seino et al. | 330/277 |
| 5,111,157 | * | 5/1992 | Komiak | 330/307 |
| 5,574,405 |   | 11/1996 | Razavi. | |
| 5,663,690 |   | 9/1997 | McGinn. | |
| 5,757,230 |   | 5/1998 | Mangelsdorf. | |
| 5,764,109 |   | 6/1998 | Kukkonen. | |
| 5,818,880 | * | 10/1998 | Kriz et al. | 330/307 |

* cited by examiner

Primary Examiner—Robert Pascal
Assistant Examiner—Patricia T. Nguyen
(74) Attorney, Agent, or Firm—Gray Cary Ware Freidenrich

(57) ABSTRACT

The low noise amplifier (LNA) of the present invention comprises an input stage including an input inductor and an input circuit portion. The input circuit portion is operably connected to the input inductor and includes an input gain portion. The LNA further comprises an output stage that is operably connected to the input stage. The output stage includes an output inductor and an output circuit portion. The output circuit portion is operably connected to the output inductor and includes an output gain portion. The input and output inductors are distinct, off-chip components. However, the input circuit portion and output circuit portion are fabricated on a single, integrated circuit chip with CMOS technology. The input stage includes an input impedance that is matched to a system impedance while the output stage includes an output impedance that is matched to a system impedance.

22 Claims, 2 Drawing Sheets

RADIO FREQUENCY LOW NOISE AMPLIFIER FABRICATED IN COMPLEMENTARY METAL OXIDE SEMICONDUCTOR TECHNOLOGY

CROSS-REFERENCE TO RELATED APPLICATION

This application claims priority under 35 USC § 119 to U.S. patent application Ser. No. 60/066,222, filed Nov. 20, 1997, which is incorporated herein by reference.

BACKGROUND OF THE INVENTION

1. Field of the Invention

This invention relates to radio frequency communication and more particularly to low noise amplifiers used in radio frequency signal transmission systems.

2. Description of Related Art

Low noise amplifiers (LNAs) are used in conjunction with numerous radio frequency functions, for example, mixers, voltage controlled oscillators, limiters, filters, etc. As such, the cost of a LNA is significant to the overall cost of the function. Generally, the cost of a LNA is determined by two factors: (1) the integrated circuit (IC) cost; and (2) the cost of off-chip components that are necessary to the operation of the LNA and to the matching of the LNA with other radio frequency functions. Currently, to achieve a low noise amplifier that is easily integrated with other radio frequency functions, it has been necessary to use a multitude of off-chip components which inherently increases the expense. Alternatively, application specific integrated circuits (ASICs) can be fabricated to include all the necessary components onto one chip, however, this process is an expensive, detailed fabrication process.

Further, while state-of-the-art LNAs are capable of providing a noise figure approaching 1.5 dB they generally use 45 to 90 mW of power, e.g. see Mini-Circuits Corporation model VAM-6, an undesirably high figure.

In an attempt to address some of the concerns described above, U.S. Pat. No. 5,574,405 describes a low noise amplifier (LNA)/mixer/frequency synthesizer circuit for an RF system. The LNA/mixer/frequency synthesizer circuit of the '405 patent is fabricated as an integrated circuit using CMOS technologies. In the '405 patent, the LNA portion of the circuit comprises a first transistor directly coupled to an antenna port, a current mirror to set a predetermined bias current to the first transistor and an inductor, which couples the first transistor to the frequency synthesizer circuit. The '405 patent does not address integrating the LNA with radio functions other than the mixer and frequency synthesizer circuits and, as such, does not provide for both input and output impedance matching. Further, the LNA provides only a single stage of amplification, limiting the overall range of programmable amplification.

As such, there is a need for a LNA that can reduce the number of off-chip components and utilize an IC fabricated with low-cost, CMOS technology to significantly reduce the cost of the LNA and the overall cost of the radio frequency functions with which the LNA is integrated while at the same time provide a noise figure comparable to current, state-of-the-art LNAs, reduced power consumption and a broad range of programmable amplification.

SUMMARY OF THE INVENTION

The needs described above are in large measure met by a radio frequency, low noise amplifier (LNA) of the present invention. The LNA of the present invention comprises an input stage including an input inductor and an input circuit portion. The input circuit portion is operably connected to the input inductor and includes an input gain portion. The LNA further comprises an output stage that is operably connected to the input stage. The output stage includes an output inductor and an output circuit portion. The output circuit portion is operably connected to the output inductor and includes an output gain portion. The input and output inductors are distinct, off-chip components. However, the input circuit portion and output circuit portion are fabricated on a single, integrated circuit chip with CMOS technology. The input stage includes an input impedance that is matched to a system impedance while the output stage includes an output impedance that is matched to the system impedance.

The present invention further comprises a method of producing an amplified radio signal. The method includes the steps of: (1) receiving a radio frequency input signal; (2) resonating an input inductance with an input reactance so as to cancel the input reactance and present an input impedance to the input signal; (3) amplifying the input signal; (4) resonating an output inductance with an output reactance so as to cancel the output reactance and present an output impedance to the amplified input signal; and (5) producing an amplified output signal by further amplifying the amplified input signal.

DETAILED DESCRIPTION OF PREFERRED EMBODIMENTS

Figure 1:
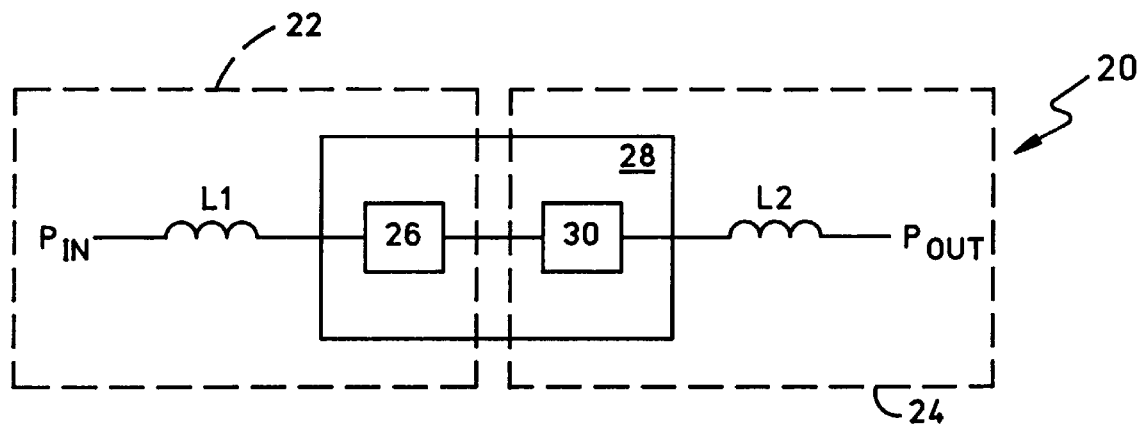
FIG. 1 is a schematic illustration of a radio frequency, low noise amplifier (LNA) according to the present invention.

The present invention provides a radio frequency, low noise amplifier (LNA) 20 fabricated in complementary metal-oxide-semiconductor (CMOS) technology. Referring to FIG. 1, LNA 20 generally includes an input stage 22 and an output stage 24 that are operably coupled. As shown, input stage 22 preferably comprises an off-chip input inductor L1 and an input circuit portion 26 that is fabricated on chip 28 by a CMOS fabrication process. Output stage 24 generally includes an off-chip output inductor L2 and an output circuit portion 30 that is also fabricated on chip 28 during the CMOS fabrication process.

Figure 2:
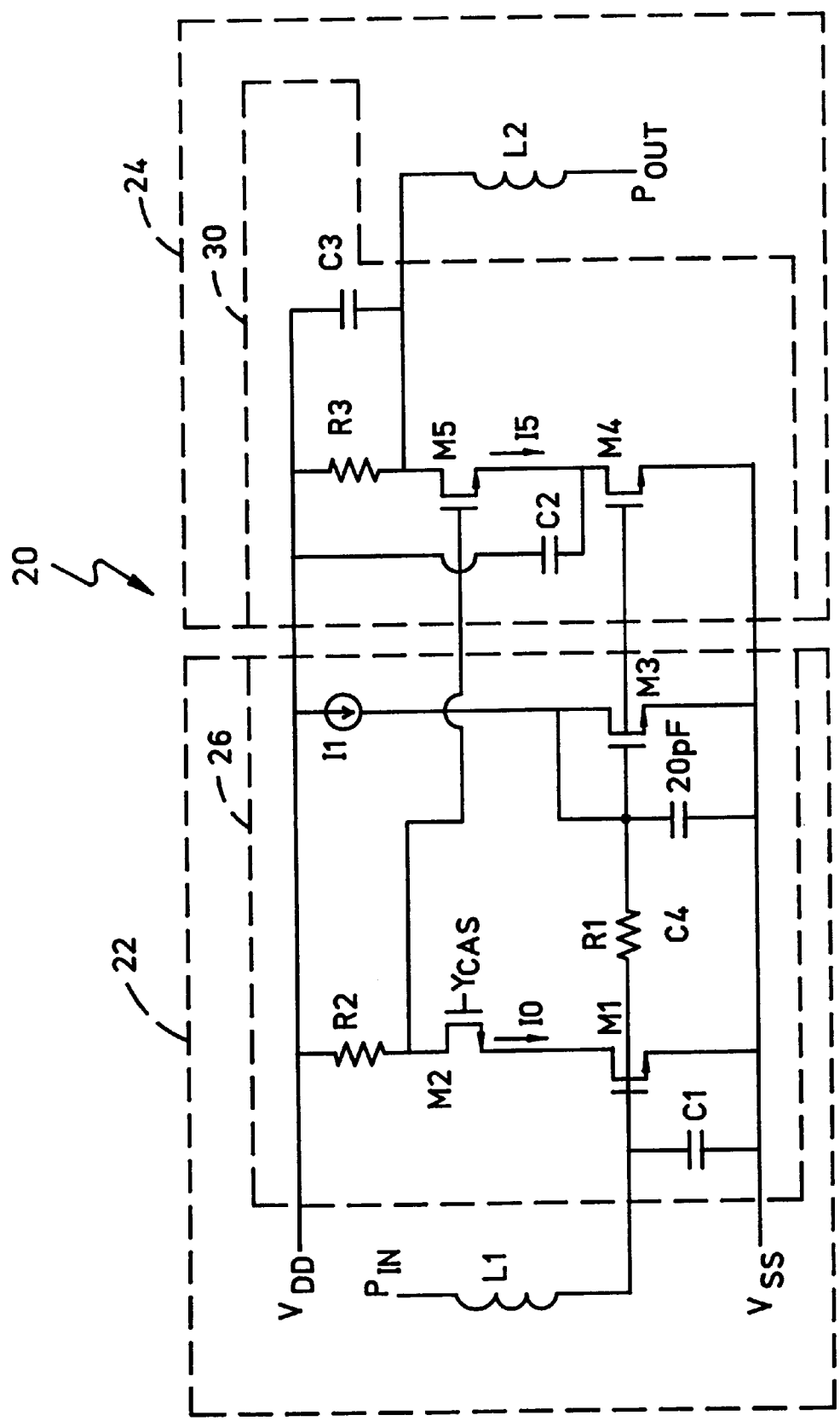
FIG. 2 is a circuit diagram of the LNA according to the present invention.

Referring to FIG. 2, a detailed schematic of LNA 20 is provided. Input circuit portion 26 comprises the elements of capacitors C1 and C4, MOSFETs M1, M2, and M3, resistors R1 and R2, and current source I1. As shown, L1 is connected to C1 and to the gate of M1. C1 and the source of M1 are tied to $V_{SS}$. The drain of M1 is tied to the source of M2 while the gate of M2 is provided with the cascoded voltage $V_{cas}$. The drain of M2 is connected to R2 which is tied to the positive voltage supply $V_{DD}$. I1 is supplied by $V_{DD}$ and is tied to the drain and gate of M3. R1 is connected between the gates of M1 and M3. C4 is connected between the gate of M3 and $V_{SS}$. The source of M3 is tied to $V_{SS}$.

Output circuit portion 30 comprises capacitors C2 and C3, MOSFETs M4, M5, and resistor R3. The gate of M4 is tied to the gate of M3 which, as previously discussed, is connected to current source I1. The source of M4 is tied to $V_{SS}$. C2 is connected between $V_{DD}$ and the drain of M4 and source of M5. R3 and C3 are connected between V and the drain of M5. Also connected to the drain of M5 is DD inductor L2.

Power is applied to LNA 20 between node $V_{DD}$ and node $V_{SS}$. In the preferred embodiment of the present invention $V_{DD}$ is 3.0 V and $V_{SS}$ is 0.0 V (ground). Regarding input stage 22, the input signal from a radio frequency function, e.g. antenna, mixer, VCO, limiter, filter, etc, is applied at node $P_{IN}$ and the amplifier output is received at node $P_{OUT}$.

In operation, M1 operates as a gain transistor for input stage 26 and is configured as a common source amplifier, amplifying the signal seen at the gate of M1. C1 is a parasitic packaging capacitance (bond pad, package pin, board capacitance, etc.) which is connected in parallel with the gate of M1. M1 is biased through a current mirror comprising I1, M3, R1 and M1, where M3 operates as the reference MOSFET carrying the reference current and M1 operates as the mirror MOSFET wherein the current 10 is a multiple of 11. As is known in the art, current mirrors are employed to generate a DC current which is a constant multiple of the reference current.

At high frequencies, R1 presents an impedance in parallel with C1 and the gate capacitance of M1, namely, CG1. In essence, this occurs because C4 provides the ground for R1, thus, R1 is effectively tied to ground in parallel with C1. M1 is driven into saturation and provides CG1 also in parallel with C1 and R1.

Figure 3:
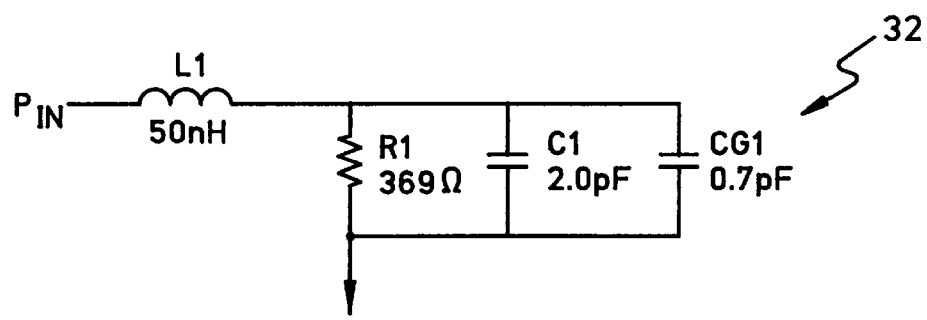
FIG. 3 is a parallel equivalent input circuit model of the LNA according to the present invention.

The equivalent parallel input circuit 32 is shown in FIG. 3. Example component values are provided for LNA 20 operating at 434 MHz, however, it should be noted that other component values may be used without departing from the spirit or scope of the invention. In view of the equivalent parallel input circuit 32, the equivalent parallel input impedance, ZP, is defined as follows:

$$ZP = \frac{R1}{[1 + j\omega(R1)CT]} \quad (1)$$

where:
ω=the radial operating frequency, and
CT (total capacitance)=C1+CG1.

Figure 4:
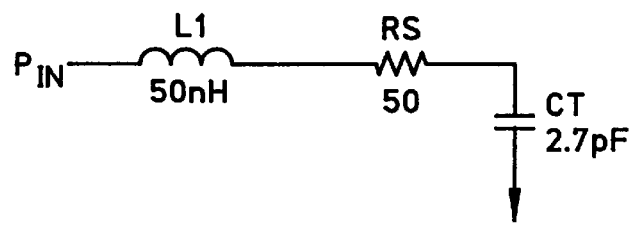
FIG. 4 is a series equivalent input circuit model for the LNA according to the present invention.

The equivalent series input circuit 34 is shown in FIG. 4. Example component values are provided for LNA 20 operating at 434 MHz, however, other component values may be used without departing from the spirit or scope of the invention. In view of the equivalent series input circuit 34, the equivalent series input impedance, ZS is defined as follows:

$$ZS = \frac{1}{\omega^2(R1)(CT^2)} - \frac{j}{\omega CT} = RS + jXS \quad (2)$$

where:
RS is the real part of ZS, and
XS is the imaginary part of ZS.
With the above equation, it is assumed that at the radio frequencies of operation:

$$[\omega(R1)CT]^2 \gg 1. \quad (3)$$

The above analysis shows that the parallel and series reactances (CT) are the same. R1 is chosen so that:

$$RS=Z0 \quad (4)$$

where: Z0 is the system characteristic matching impedance e.g. Z0≈50 Ω.

L1 is chosen to resonate with CT at the operating frequency according to:

$$L1 = \frac{1}{[\omega^2(CT)]}. \quad (5)$$

L1 acts to cancel the capacitance CT, leaving only a real component to the input impedance, RS, equal to Z0. For example, using the 434 MHZ series equivalent input circuit of FIG. 4, it can be seen that L1 resonates with CT, i.e.:

$$\omega_0 = \frac{1}{\sqrt{(L1)(CT)}} \quad (6)$$

where: $\omega_0=2\pi(434 \text{ MHz})$.
Hence, at 434 MHz the reactance of L1 and CT cancel resulting in the input impedance, RS, equal to 50 ohms. As such, the overall effect is to amplify the voltage signal at the gate of M1 (see FIG. 2), resulting in an enhanced signal-to-noise ratio of the amplifier even with low transistor conductance.

M2 provides a cascode to M1 to reduce the Miller capacitance effect seen at the amplifier input, $P_{IN}$. As is commonly understood to those skilled in the art, amplifying transistor M1 has a small gate-to-drain capacitance on the order of 1 pF. Due to the Miller effect, the small gate-to-drain capacitance gives rise to a fairly large input capacitance that can limit the high-frequency response of the amplifier. By reducing the Miller capacitance, the high-frequency response of LNA 20 is improved.

Regarding output stage 24, M5 is configured as a common source amplifier amplifying the signal seen at the gate of M5. The signal at the gate of M5 is in essence the amplified signal from M1. As can be seen, M5 is current biased with current source transistor M4. Current source transistor M4 forms part of a second current mirror with I1 and M3. A DC biasing current I5 is provided as a multiple of reference current I1. C2 provides the small signal ground for the source of M5. R3 and parasitic package capacitance C3 provide a parallel output impedance which resonates with output inductor L2, in a similar manner as input inductor L1, described above. R3 is chosen such that at the operating frequency, the series output impedance is real only (i.e. no reactive or imaginary portion) and equal to Z0, the system characteristic matching impedance, which is usually approximately 50 ohms. In the case of output stage 24, the total capacitance, CT, is the sum of the package parasitic capacitance, C3, and the drain capacitance of M5.

In essence, LNA 20 operates as described below. At a desired operating frequency of LNA 20, L1 resonates with the input capacitance CT whereby CT operates to cancel the impedance presented by L1. As such, the input signal at $P_{IN}$ is effectively impacted only by the remaining input impedance R1. The signal across R1 is seen at the gate of M1, wherein M1 amplifies the gate signal. The amplified signal is further amplified by M5. As with the input impedance, capacitor C3 and inductor L2 are designed to resonate with each other and cancel the impedance presented by each, leaving only R3 as the output impedance. Thus, $P_{out}$ is effectively the signal seen at the output of M5 less any impact from R3.

Input circuit portion 26 and output circuit portion 30, as indicated above, are preferably fabricated on a single chip utilizing a low-cost, CMOS fabrication process. A submicron CMOS process featuring low polysilicon gate resistance, as is currently available with polycide processes, is preferred. In general, a submicron process is needed to meet the frequency operation requirements for typical low cost radio applications, for instance, by way of a couple of non-limiting example, 434 MHz keyless entry systems, 900 MHz cordless/cellular phones and 1.9 GHz PCS phones. The polycide CMOS process used in the present invention will also act to provide a high quality factor (low loss) transistor gate capacitance. Because LNA 20 minimizes the number of off-chip components, utilizing only two off-chip inductors, and uses a single IC that may be mass manufactured with the current lowest cost technology, CMOS technology, LNA 20 is relative inexpensive. Further, because off-chip inductors L1 and L2 provide system impedance matching, LNA 20 may easily be integrated in numerous radio functions, e.g. mixers, VCOs, limiters, filters, etc.

Additionally, LNA 20 provides a low noise figure. The input and output voltage signals are enhanced by resonating the parasitic transistor capacitance and package capacitance with the off-chip inductors, which results in a reduction in amplifier noise figure. Further, MOS transistors have to input gate current and, therefore, do not suffer from input base shot noise as in bipolar junction transistors. Moreover, the modern submicron CMOS processes, such as the polycide process preferably used for LNA 20 of the present invention, usually include a low resistance (less than 1 ohm), salicided polysilicon gate. As is known in the industry, gate resistance is a common source of thermal noise. As such, in the present invention, by keeping the gate resistance low, the thermal noise is greatly reduced. Specifically, LNA 20 of the present invention is capable of less than 2 dB noise figure at 434 MHz. Commercially available, expensive, state-of-the-art LNAs achieve 1.5 dB which is only 0.5 dB better than LNA 20. As such, LNA 20 is a desirable low-cost alternative.

LNA 20 also includes the feature of low power consumption. Typical current consumption of LNA 20 is approximately 5 mA with a 3 V power supply resulting in approximately a 15 mW power dissipation. Typical commercially available LNAs drain 15 to 30 mA at a 3 V power supply. As such, LNA 20 of the present invention is capable of providing 3 to 6 times the power reduction of commercially available LNAs. In addition to being low cost and having low power consumption, LNA 20 also has a high power gain. Specifically, LNA 20 is capable of greater than 30 dB total gain at 434 MHz. This high gain is primarily achieved by resonating the input and output parasitic capacitances.

The present invention may be embodied in other specific forms without departing from the essential attributes thereof; therefore, the illustrated embodiments should be considered in all respects as illustrative and not restrictive, reference being made to the appended claims rather than to the foregoing description to indicate the scope of the invention.

What is claimed:

1. A radio frequency amplifier, comprising:
   an input stage including an input inductor and an input circuit portion operably connected to said input inductor, wherein said input circuit portion includes an input gain portion;
   an output stage operably connected to said input stage, said output stage including an output inductor and an output circuit portion operably connected to said output inductor, wherein said output circuit portion includes an output gain portion wherein said output stage has an output impedance, an output reactance, and an output inductance and wherein said output impedance is designed to match a system impedance upon a resonation of said output inductance with said output reactance; and
   wherein said input inductor and said output inductor are distinct components, and wherein said input circuit portion and said output circuit portion are fabricated on a single, integrated circuit chip with CMOS technology.

2. The amplifier of claim 1, wherein said input stage has an input impedance, an input reactance, and an input inductance, and wherein said input impedance is designed to match a system impedance upon a resonation of said input inductance with said input reactance.

3. The amplifier of claim 2, wherein the resonation of said input inductance with said input reactance reduces the noise in said amplifier.

4. The amplifier of claim 1, wherein the resonation of said output inductance with said output reactance reduces the noise in said amplifier.

5. A radio frequency amplifier, comprising:
   an input stage having an input inductance, an input reactance, and an input impedance, and including an input gain portion, wherein said input inductance resonates with said input reactance; and
   an output stage operably coupled to said input stage, wherein said output stage has an output inductance, an output reactance, and an output impedance, and including an output gain portion, wherein said output inductance resonates with said output reactance.

6. The amplifier of claim 5, wherein said input stage is comprised of an input inductor and an input circuit portion operably connected to said input inductor, said input circuit portion including said input gain portion, and, wherein said output stage is comprised of an output inductor and an output circuit portion operably connected to said output inductor, said output circuit portion including said output gain portion.

7. The amplifier of claim 6, wherein said input circuit portion and said output circuit portion are fabricated on a single integrated circuit (IC) chip, and, wherein said input inductor and said output inductor are off-chip.

8. The amplifier of claim 7, wherein said single IC chip is fabricated with a CMOS process.

9. The amplifier of claim 5, wherein said input impedance is designed to substantially match a system impedance upon the resonation of said input inductance and said input reactance.

10. The amplifier of claim 5, wherein said output impedance is designed to substantially match a system impedance upon the resonation of said output inductance and said output reactance.

11. The amplifier of claim 5, wherein the resonation of said input inductance with said input reactance and the resonation of said output inductance with said output reactance results in a low noise figure for said amplifier.

12. A radio frequency amplifier having an operating frequency, an input signal and an output signal, comprising:
   input means for receiving and amplifying said input signal, wherein said input means has input inductance means for presenting an inductance to said input signal and input reactance means for presenting a reactance to said input signal, wherein said input inductance means resonates with said input reactance means at said operating frequency, and wherein said input means further has input impedance means for presenting an impedance to said input signal, and wherein said input means includes input gain means for amplifying said input signal; and an output means operably coupled to said input means, said output means for receiving the amplified input signal from said input means and for producing said output signal, wherein said output means has output inductance means for presenting an inductance to said amplified input signal and an output reactance means for presenting a reactance to said amplified input signal, wherein said output inductance means resonates with said output reactance means at said operating frequency, and wherein said output means further has an output impedance means for presenting an impedance to said amplified input signal, and wherein said output means includes output gain means for amplifying said amplified input signal.

13. The amplifier of claim 12, wherein said input means is comprised of an input inductor and an input circuit portion that includes said input gain means, wherein said input circuit portion is operably connected to said input inductor, and wherein said output means is comprised of an output inductor and an output circuit portion that includes said output gain means, and wherein said output circuit portion is operably connected to said output inductor.

14. The amplifier of claim 13, wherein said input circuit portion and said output circuit portion are fabricated on a single integrated circuit (IC) chip, and, wherein said input inductor and said output inductor are off-chip.

15. The amplifier of claim 14, wherein said single IC chip is fabricated with a CMOS process.

16. The amplifier of claim 12, wherein said input impedance means is designed to substantially match a system impedance upon the resonation of said input inductance means and said input reactance means.

17. The amplifier of claim 12, wherein said output impedance means is designed to substantially match a system impedance upon the resonation of said output inductance means and said output reactance means.

18. The amplifier of claim 12, wherein the resonation of said input inductance means and said input reactance means and the resonation of said output inductance means and said output reactance means results in a low noise figure for said amplifier.

19. A method of producing an amplified radio frequency signal, comprising the steps of:
   receiving a radio frequency input signal;
   resonating an input inductance with an input reactance so as to cancel said input reactance and present an input impedance to said input radio frequency signal;
   amplifying said radio frequency input signal;
   resonating an output inductance with an output reactance so as to cancel said output reactance and present an output impedance to said amplified radio frequency input signal; and
   producing an amplified output radio signal by further amplifying said amplified radio frequency input signal.

20. The method of claim 19, wherein said input impedance substantially matches a system impedance.

21. The method of claim 19, wherein said output impedance substantially matches a system impedance.

22. The method of claim 20, wherein the resonating of said input inductance with said input reactance and the resonating of said output inductance with said output reactance produces an amplified output radio signal with low noise.

* * * * *